(12) United States Patent
Futatsuyama

(10) Patent No.: US 8,385,119 B2
(45) Date of Patent: Feb. 26, 2013

(54) NON-VOLATILE SEMICONDUCTOR MEMORY DEVICE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 172 days.

(21) Appl. No.: 13/051,337

(22) Filed: Mar. 18, 2011

(65) Prior Publication Data

US 2012/0002472 A1 Jan. 5, 2012

(30) Foreign Application Priority Data

Jul. 2, 2010 (JP) .................................. 2010-152014

(51) Int. Cl.
*G11C 11/34* (2006.01)
(52) U.S. Cl. .............................. 365/185.09; 365/185.22
(58) Field of Classification Search ............. 365/185.09, 365/185.22
See application file for complete search history.

(56) References Cited

U.S. PATENT DOCUMENTS 6,487,122 B2 * 11/2002 Shibata et al. ........... 365/185.22
7,764,542 B2 7/2010 Edahiro et al.
2007/0076487 A1 4/2007 Takeuchi et al.

FOREIGN PATENT DOCUMENTS

JP 2008-257781 10/2008

OTHER PUBLICATIONS

U.S. Appl. No. 13/418,955, filed Mar. 13, 2012, Futatsuyama.
Seung-Ho Chang, et al., "A 48nm 32Gb 8-Level NAND Flash Memory with 5.5MB/s Program Throughput", International Solid State Circuits Conference, Session 13, Flash Memory, 13.3, Digest of Technical Papers, Feb. 10, 2009, 3 pages.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A non-volatile semiconductor memory device according to an embodiment includes: a data write portion configured to repeat a write loop until data write is complete, the write loop including a program operation of applying a selected word-line with a program voltage necessary for program and a verify operation of applying the selected word-line with a verify voltage necessary for verify, the program voltage being changed for each write loop by a predetermined step width, the data write being performed in units of a page including a plurality of memory cells selected by the selected word-line; and an endurance determination portion configured to determine the endurance of the memory cells of the page, the data write portion supplies the selected word-line with a program voltage of a step width depending on the endurance.

20 Claims, 17 Drawing Sheets

FIG. 5

| #Loop | 1 | ... | Nb-1 | Nb | ... | Nc-1 | Nc | ... | Na' | Na'+1 | ... | Nb' | Nb'+1 | ... | N |
|---|---|---|---|---|---|---|---|---|---|---|---|---|---|---|---|
| A LEVEL | O | ... | O | O | ... | O | O | ... | O | | ... | | | ... | |
| B LEVEL | | ... | | O | ... | O | O | ... | O | O | ... | O | | ... | |
| C LEVEL | | ... | | | ... | | O | ... | O | O | ... | O | O | ... | O |

FIG. 7
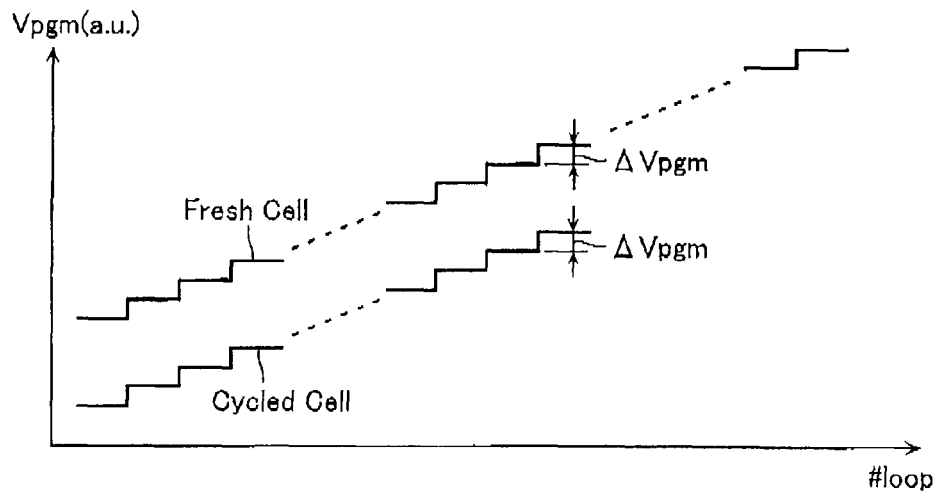
FIG. 8
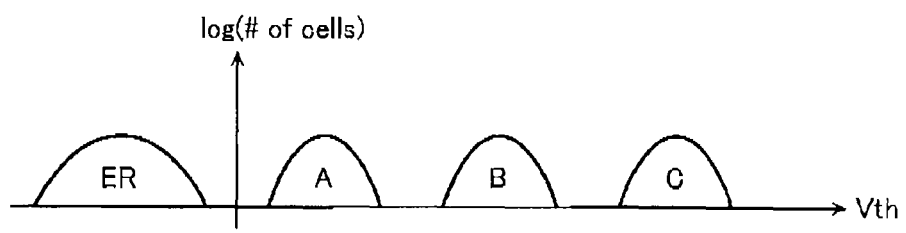
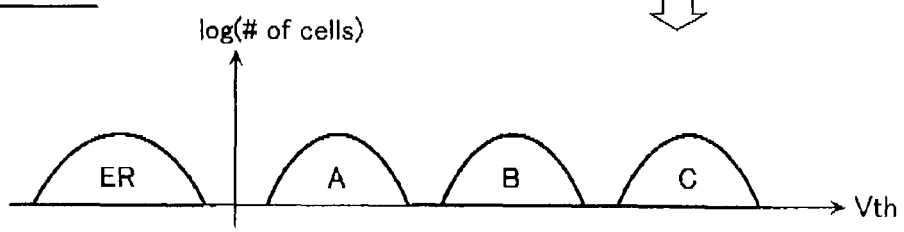

FIG. 13

Fresh Cell

| #Loop | 1 | ... | Nb1 | ... | Nc1 | ... | Na1' | ... | Nab' | ... | N1 |
|---|---|---|---|---|---|---|---|---|---|---|---|
| A LEVEL | ○ | ○ | | | | | | | | | |
| B LEVEL | B Verify Skip | | ○ | ○ | ○ | ○ | ○ | | | | |
| C LEVEL | C Verify Skip | | | | ○ | ○ | ○ | ○ | ○ | ○ | ○ |

Cycled Cell

| #Loop | 1 | ... | Nb2 | ... | Nc2 | ... | Na2' | ... | Nb2' | ... | N2 |
|---|---|---|---|---|---|---|---|---|---|---|---|
| A LEVEL | ○ | ○ | | | | | | | | | |
| B LEVEL | B Verify Skip | | ○ | ○ | ○ | ○ | ○ | | | | |
| C LEVEL | C Verify Skip | | | | ○ | ○ | ○ | ○ | ○ | ○ | ○ |

|  | Vpgm0(R) |
|---|---|
| WL2k−1 | Vpgm0(R,2k−1) |
| WL2m | Vpgm0(R,2m) |
| WL2m−1 | Vpgm0(R,2m−1) |
| WL0 | Vpgm0(R,0) |

| Vpgm0(R) | | NAND string (Block) position | | |
|---|---|---|---|---|
| | | Top | Middle | Bottom |
| WL position | WL2k-1 | Vpgm0(R,2k-1,T) | Vpgm0(R,2k-1,M) | Vpgm0(R,2k-1,B) |
| | WL2m | Vpgm0(R,2m,T) | Vpgm0(R,2m,M) | Vpgm0(R,2m,B) |
| | WL2m-1 | Vpgm0(R,2m-1,T) | Vpgm0(R,2m-1,M) | Vpgm0(R,2m-1,B) |
| | WL0 | Vpgm0(R,0,T) | Vpgm0(R,0,M) | Vpgm0(R,0,B) |

NON-VOLATILE SEMICONDUCTOR MEMORY DEVICE

CROSS-REFERENCE TO RELATED APPLICATIONS

This application is based upon and claims the benefit of priority from the prior Japanese Patent Application No. 2010-152014, filed on Jul. 2, 2010, the entire contents of which are incorporated herein by reference.

FIELD

The embodiments of the present invention relate to a non-volatile semiconductor memory device.

BACKGROUND

A known non-volatile semiconductor memory device which is electrically rewritable and can be highly integrated is a NAND flash memory. The NAND flash memory includes a NAND string in which a plurality of memory cells are connected in series and the adjacent memory cells share a source/drain diffusion layer. The NAND string has ends connected to a bit-line and a source-line, respectively, via a select gate transistor. Such a NAND string configuration allows for a smaller unit cell area and a larger capacity than a NOR flash memory.

The memory cell in the NAND flash memory includes a semiconductor substrate and a tunnel insulating film, a charge accumulation layer (floating gate), an inter-gate dielectric film, and a control gate, which are stacked in this order on the substrate. The memory cell stores data in a non-volatile manner according to the charge accumulation state of the floating gate. The memory cell stores binary data using, for example, data "0" representing the high threshold voltage state in which the floating gate is injected with electrons and data "1" representing the low threshold voltage state in which electrons in the floating gate are discharged. The threshold voltage distribution for writing may be further divided to provide a multi-level storage such as a four-level or eight-level storage.

The NAND flash memory may be written with data usually by supplying the control gate of the memory cell with program voltages necessary for the charge accumulation. The program voltages are provided in a repeated and stepped-up manner to gradually change the threshold voltage of the memory cell to the desired threshold voltage. In this case, a large step width of the program voltage may allow for a rapid data write process, while increasing the threshold voltage distribution and thus reducing the reliability. Conversely, a small step width of the program voltage may decrease the threshold voltage distribution and thus improve the reliability, while slowing the data write process. It is thus necessary to set an appropriate step width according to the program speed of the memory. The same holds true for a charge-trap type non-volatile memory in which the charge accumulation layer includes an insulating film such as an MONOS film.

BRIEF DESCRIPTION OF THE DRAWINGS

FIG. 5 shows the relationship between the number of write loops and the generation of the threshold voltage distribution for the program voltage shown in FIG. 4 being supplied to the selected word-line;

FIG. 7 shows an image of the program voltage supplied to the selected word-line in the non-volatile semiconductor memory device including the initial voltage adjustment function shown in FIG. 6;

FIG. 8 shows the threshold voltage distributions of the memory cells of the non-volatile semiconductor memory device;

FIG. 13 illustrates a change of the length to be verify skipped of the verify skip function;

DETAILED DESCRIPTION

A non-volatile semiconductor memory device according to an embodiment includes a memory cell array including a plurality of bit-lines, a plurality of word-lines intersecting the bit-lines, a source-line, and a plurality of NAND cell units, each NAND cell unit including a plurality of memory cells connected in series, each memory cell including a control gate connected to one of the word-lines, each NAND cell unit including ends connected to one of the bit-lines and the source-line, respectively; a data write portion configured to write data to the memory cell array by repeating a write loop until the data write is complete, the write loop including a program operation of applying a selected word-line of the word-lines with a program voltage necessary for program and a verify operation of applying the selected word-line with a verify voltage necessary for verify, the program voltage being changed for each write loop by a predetermined step width, the data write being performed in units of a page including a plurality of memory cells selected by the selected word-line; and an endurance determination portion configured to determine the endurance of the memory cells of the page, the data write portion supplying the selected word-line with a program voltage of a step width depending on the endurance.

With reference to the drawings, a non-volatile semiconductor memory device according to embodiments will be described below.

First Embodiment

Entire Configuration

First, the entire configuration of a non-volatile semiconductor memory device according to a first embodiment will be described.

Figure 1:
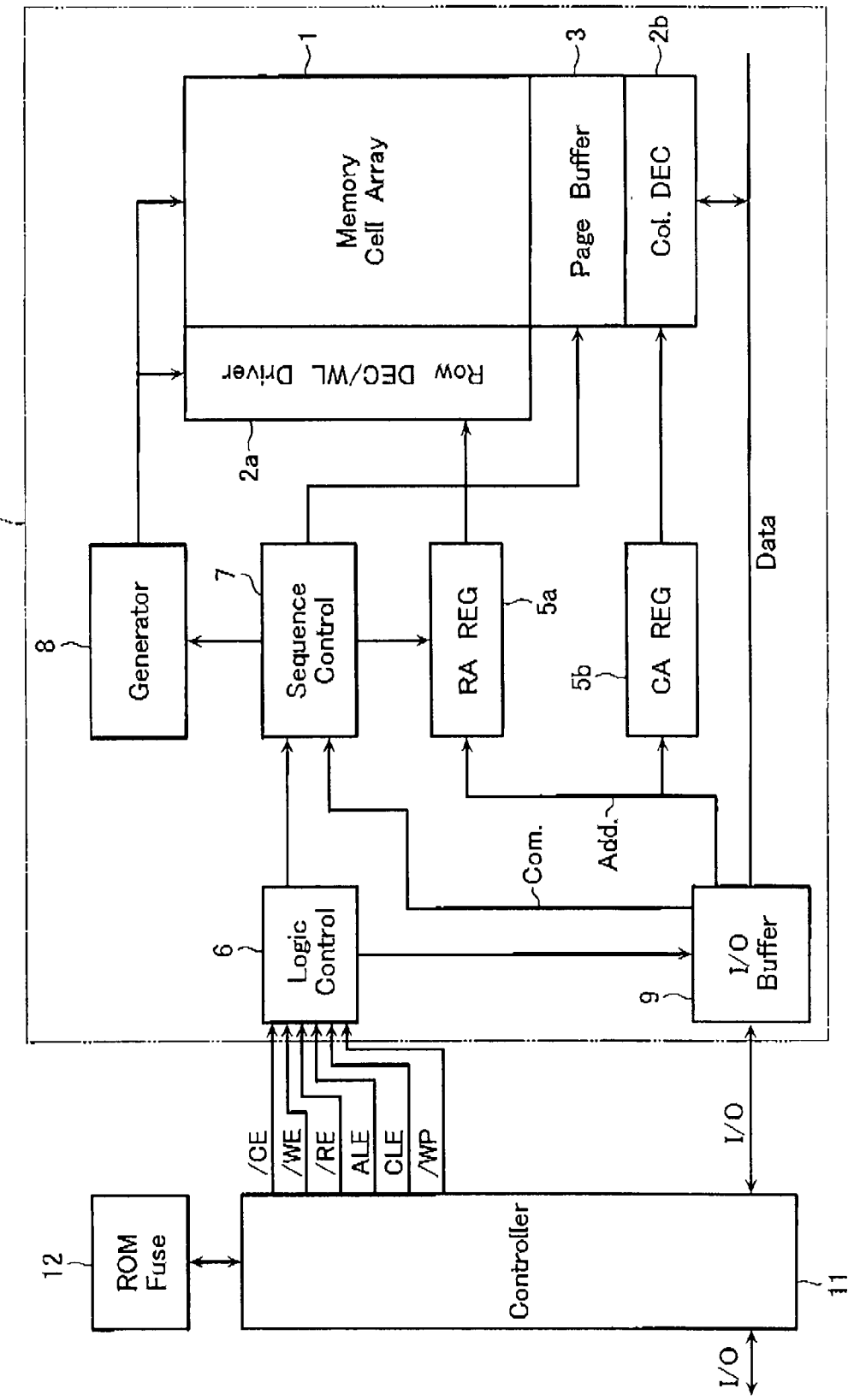
FIG. 1 is a block diagram of a non-volatile semiconductor memory device according to a first embodiment.

FIG. 1 is a block diagram of the non-volatile semiconductor memory device according to this embodiment.

The NAND flash memory includes a NAND chip 10, a controller 11 for controlling the NAND chip 10, and a ROM fuse 12 for storing information for use in a step adjustment function as described below.

The NAND chip 10 includes a memory cell array 1. The memory cell array 1 includes a plurality of floating-gate memory cells MC arranged in a matrix as described below. A row decoder/word-line driver 2a, a column decoder 2b, a page buffer 3, and a voltage generation circuit 8 together form a data write portion for writing and reading data from the memory cell array 1 in units of pages. The row decoder/word-line driver 2a drives a word-line and a select gate line in the memory cell array 1. The page buffer 3 includes a sense amplifier circuit and a data holding circuit for one-page data. The buffer 3 reads and writes data from the memory cell array 1 in units of pages.

One-page read data of the page buffer 3 is sequential column selected by the column decoder 2b. The data is then output to an external I/O terminal via an I/O buffer 9. Write data from the I/O terminal is selected by the column decoder 2b and is loaded into the page buffer 3. The page buffer 3 is loaded with one-page write data. Row and column address signals are input via the I/O buffer 9. The signals are then transferred to the respective row decoder 2a and column decoder 2b. A row address register 5a holds, in an erase operation, an erase block address and holds, in a write or read operation, a page address. A column address register 5b receives a start column address for loading write data before starting the write operation or a start column address for the read operation. Until a write enable /WE or a read enable /RE is toggled in a predetermined condition, the column address register 5b holds the received column address.

A logic control circuit 6 controls, according to a chip enable signal /CE, a command enable signal CLE, an address latch enable signal ALE, a write enable signal /WE, a read enable signal /RE, and other control signals, a command or address input, a data input/output. The read operation or the write operation is performed by a command. In response to the command, the sequence control circuit 7 performs the sequence control of the read, write, or erase operation. The voltage generation circuit 8 is controlled by the control circuit 7 to generate predetermined voltages necessary for various operations.

The controller 11 controls the data write and read under the condition adequate for the present write state of the NAND chip 10. It should be appreciated that a portion of the read control as described below may be performed by the NAND chip 10.

<Memory Cell Array>

A description is now given of the memory cell array 1 in the non-volatile semiconductor memory device according to this embodiment.

Figure 2:
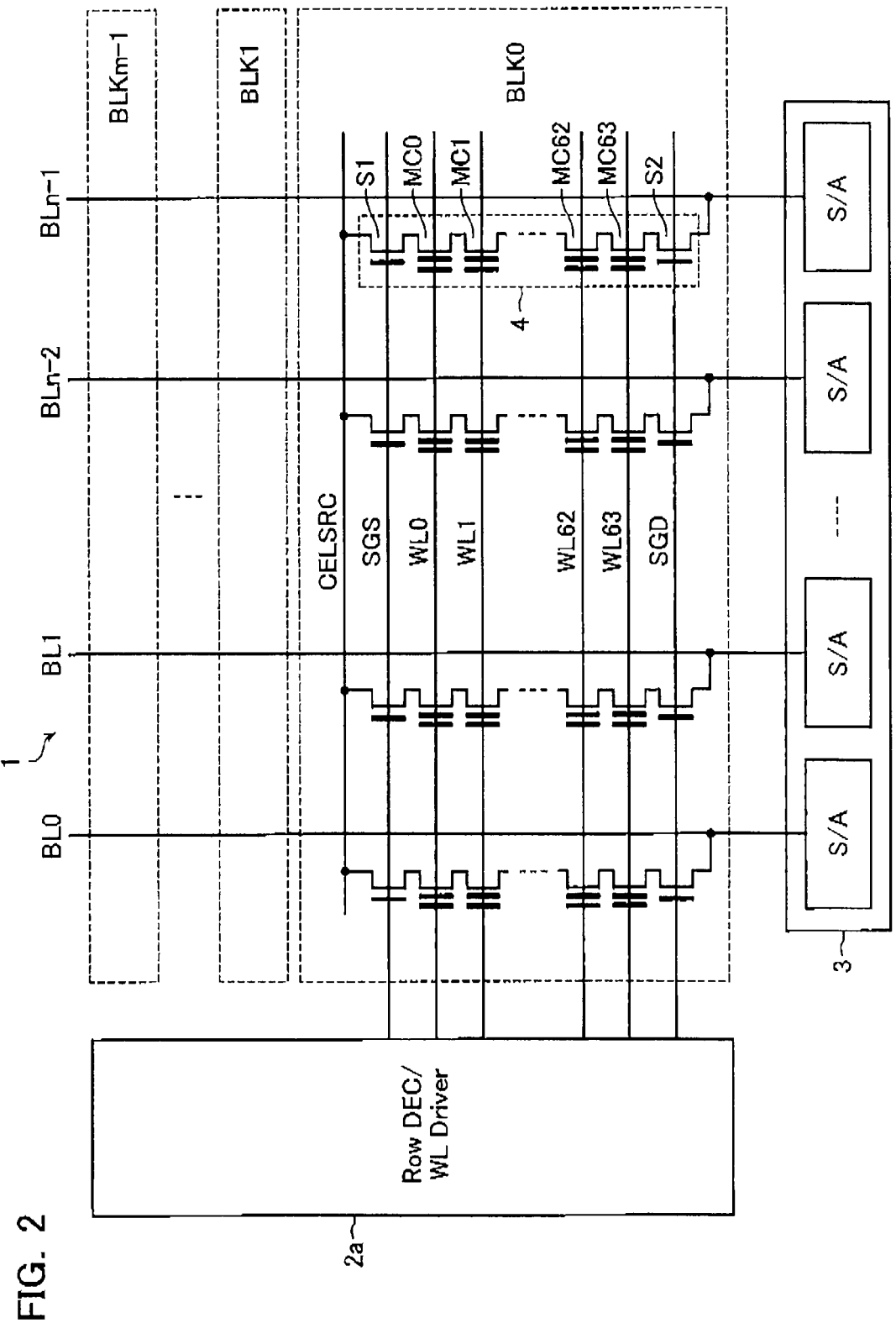
FIG. 2 is a circuit diagram of a memory cell array of the non-volatile semiconductor memory device according to this embodiment.

FIG. 2 is a circuit diagram of the memory cell array 1. With reference to FIG. 2, a NAND string 4 includes 64 memory cells MC0 to MC63 connected in series and select gate transistors S1 and S2 connected to the respective ends of the memory cells. The select gate transistor S1 has a source connected to a common source-line CELSRC. The select gate transistor S2 has a drain connected to a bit-line BL (BL0 to BLn−1). The memory cells MC0 to MC63 have their control gates connected to respective word-lines WL (WL0 to WL63). The select gate transistors S1 and S2 have their gates connected to respective select gate line SGS and SGD.

The range including a plurality of memory cells MC along one word-line WL provides a page as the unit for collectively reading or writing data. The range including a plurality of NAND strings 4 arranged in the word-line WL direction provides a cell block BLK as the unit for collectively erasing data. With reference to FIG. 2, each bit-line BL is shared by a plurality of cell blocks BLK0 to BLKm−1 arranged in the bit-line BL direction. The cell blocks BLK0 to BLKm−1 together form the cell array 1. The word-lines WL and the select gate lines SGS and SGD are driven by the row decoder 2a. The bit-lines BL are connected to respective sense amplifier circuits S/A of the page buffer 3.

A description is here given of a "page" as the access unit to the NAND flash memory. Note that in the following discussion, a "page" has different two meanings.

The first meaning is a "page" as the collective data access unit along one word-line. This includes two schemes: a collective access to all memory cells connected to one word-line (ABL scheme); and an access to every other memory cells (E/O scheme). For the E/O scheme, the memory cells connected to the same word-line are categorized into an "even page" and an "odd page." FIG. 2 shows, by way of example, the ABL scheme.

The second meaning is a "page" showing the hierarchy of stored data when storing multi-bit in one memory cell. The page is here referred to as a lower (L) page, a middle (M) page, an upper (U) page or the like.

<Data Write>

A description is now given of the data write to the non-volatile semiconductor memory device according to this embodiment.

Figure 3:
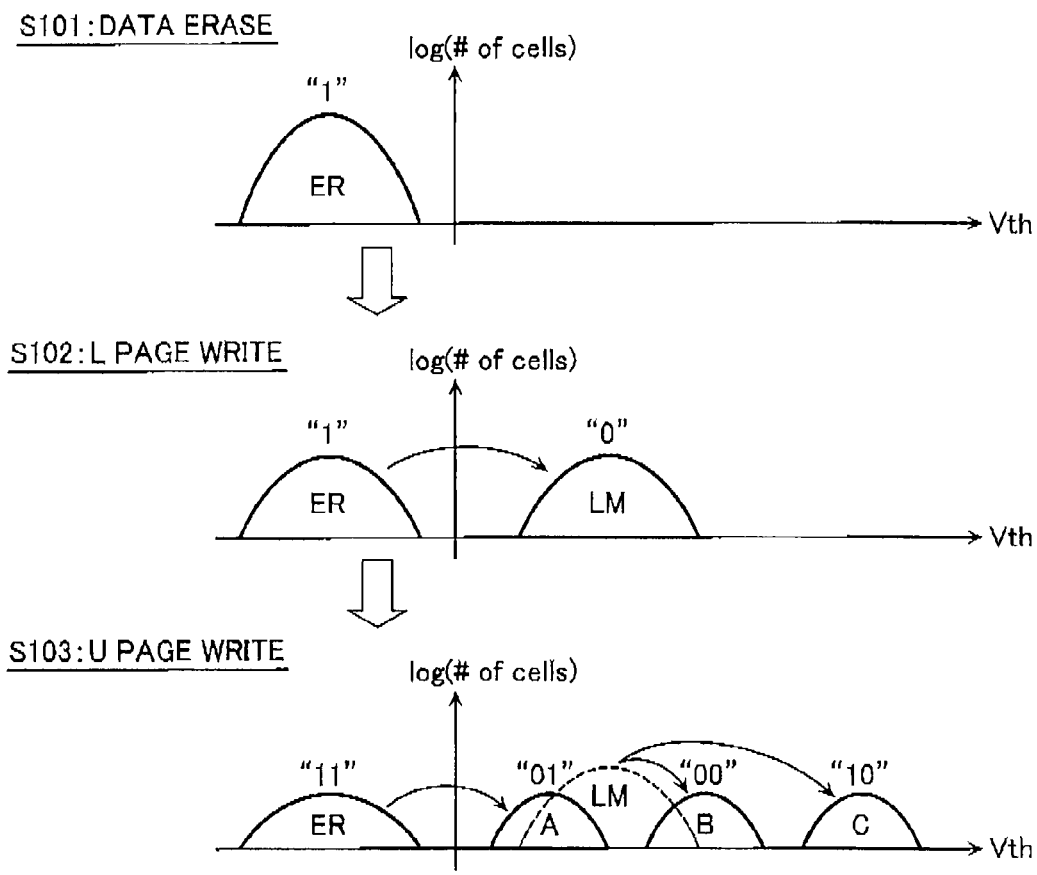
FIG. 3 shows a change of the threshold voltage distribution of the memory cell in data write for storing two-bit per one cell in the non-volatile semiconductor memory device according to this embodiment.

FIG. 3 shows a change of the threshold voltage distribution of the memory cell in the data write for storing two-bit per one cell.

First, at step S101, data is collectively erased over the whole cell block. The threshold voltages of all memory cells MC in the cell block thus change to the lowest ER level.

Then, at step S102, the first write step, L page write, is performed according to the lower bit of write data. For the lower bit of "1," the threshold voltages of the memory cells remain at the ER level. For the lower bit of "0," the threshold voltages of the memory cells change from the ER level to the LM level between the A level and the B level.

Finally, at step S103, the second write step, U page write, is performed according to the upper bit of write data. If the threshold voltage of the memory cell MC is the ER level, then, for the higher data of "1," the threshold voltage of the memory cell remains at the ER level. Conversely, for the higher data of "0," the threshold voltages of the memory cells change to the A level. If the threshold voltage of the memory cell is the LM level, then, for the higher data of "0," the threshold voltage of the memory cell changes to the B level. Conversely, for the higher data of "1," the threshold voltage of the memory cell changes to the C level.

As described above, two-bit data is written to the memory cell by two write steps.

A description is now given of a program voltage and a verify voltage supplied to the selected word-line in the data write.

Figure 4:
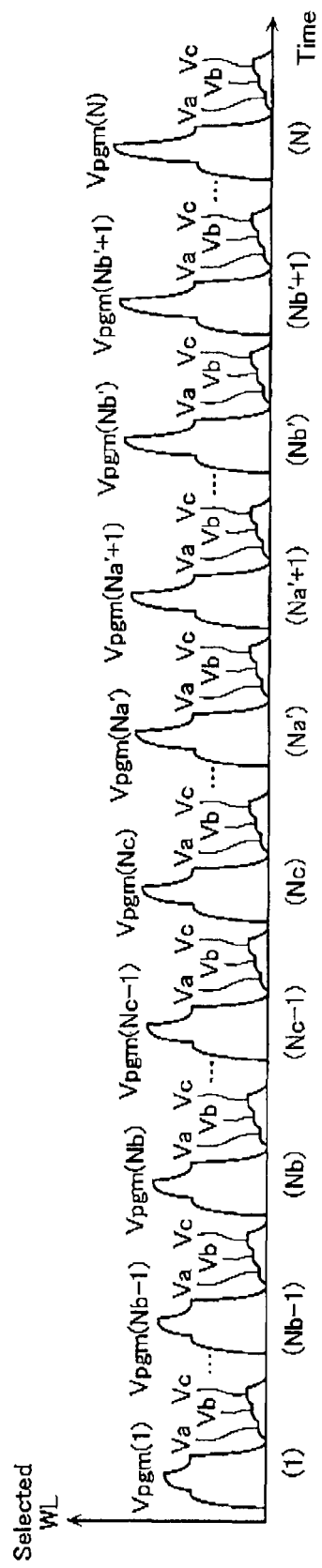
FIG. 4 is a waveform chart of a program voltage and a verify voltage supplied to a selected word-line of the non-volatile semiconductor memory device.

FIG. 4 is a waveform chart of a program voltage Vpgm supplied to the selected word-line WL in the data write, and verify voltages Va, Vb, and Vc necessary to verify the A, B, and C levels respectively. FIG. 5 shows the threshold voltage that may change for the supply of the program voltage Vpgm shown in FIG. 4.

In the following discussion, the memory cell whose threshold voltage is to be changed to the ER level is referred to as a "memory cell MC (ER)." The same holds true for the memory cells to be changed to the A, B, and C levels.

It is assumed here that the L page write has been completed. The description thus starts at the U page write. It is therefore assumed that the threshold voltages of the memory cells MC (ER) and MC (A) have already been changed to the ER level and the threshold voltages of the memory cells MC (B) and MC (C) have been changed to the LM level.

It is also assumed, by way of example, that one write loop includes one program operation and one verify operation.

In the program operation, as shown in FIG. 4, the selected word-line is supplied with one pulsed program voltage Vpgm. The program voltage Vpgm is stepped up every time the write loop is repeated. Referring to FIG. 4 and FIG. 5, for example, for 1<Nb<Nc<Na'<Nb'<N, the program voltages Vpgm (1) to Vpgm (Na') supplied at the respective 1st to Na'th write loops each have a program voltage that may change the threshold voltage of the memory cell to the A level. The program voltages Vpgm (Nb) to Vpgm (Nb') supplied at the respective Nbth to Nb'th write loops each have a program voltage that may change the threshold voltage of the memory cell to the B level. The program voltages Nc to N supplied at the respective Ncth to Nth write loops each have a program voltage that may change the threshold voltage of the memory cell to the C level. For the program voltage Vpgm supplied, the memory cell MC (A) changes its threshold voltage from the ER level to the A level in the 1st to Na'th write loops. The memory cell MC (B) changes its threshold voltage from the LM level to the B level in the Nbth to Nb'th write loops. The memory cell MC (C) changes its threshold voltage from the LM level to the C level in the Nc to Nth write loops. The N write loops thus write data in all memory cells MC of a page.

In the verify operation, as shown in FIG. 4, the selected word-line is supplied with three verify voltages Va, Vb, and Vc in sequence. It is thus verified whether the memory cells MC (A), MC (B), and MC (C) have changed their threshold voltages to the respective A level, B level, and C level. For a memory cell that has passed the verify operation, the program operation is thus inhibited in the subsequent write loops.

<Adjustment of Initial Voltage of Program Voltage>

Referring to FIG. 4 and FIG. 5, while the N write loops complete the data write, the program speed is different for each block, each word-line, each page, and each memory cell. Moreover, even for the same page or memory cell, the program speed usually changes over the write/erase cycles. The initial voltage of the program voltage should thus be appropriately adjusted to the number of write/erase cycles.

In this embodiment, therefore, the initial voltage of the program voltage is adjusted according to each page's write characteristics (this function is hereinafter referred to as the "initial voltage adjustment function").

This initial voltage adjustment function performs the following processes. In a predetermined write-loop of the L page write, the number of memory cells is counted that has reached a predetermined threshold voltage. If the program voltage at which the predetermined number of memory cells has reached is high, the initial voltage of the program voltage in the U page write is adjusted to a higher value. If the program voltage at which the predetermined number of memory cells has reached is low, the initial voltage of the program voltage in the U page write is adjusted to a lower value.

Figure 6:
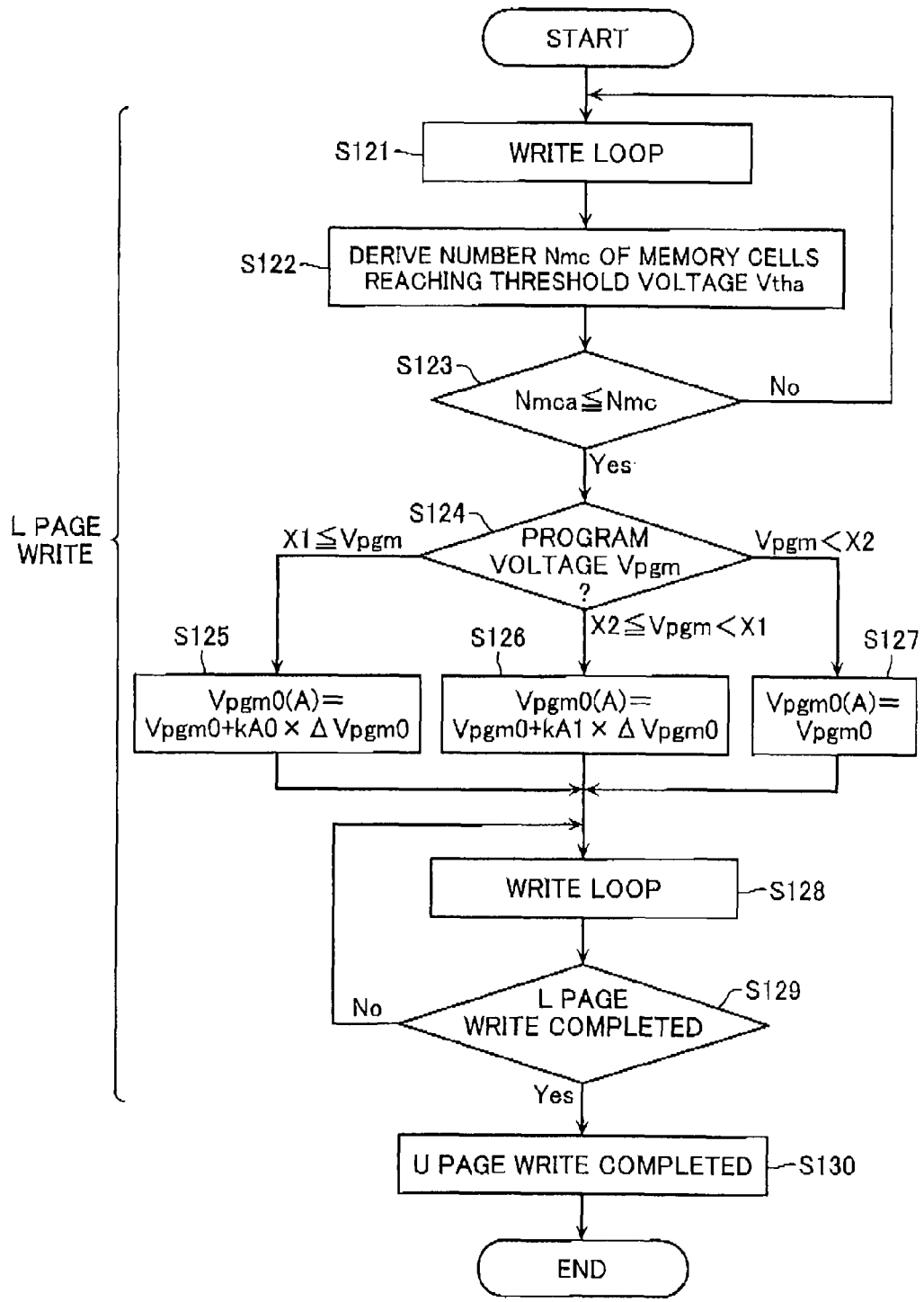
FIG. 6 is an adjustment flow of the initial voltage of the program voltage by an initial voltage adjustment function of the non-volatile semiconductor memory device according to this embodiment.

FIG. 6 shows the flow of the data write process by the initial voltage adjustment function. FIG. 6 shows an example where if the program voltage at which the predetermined number of memory cells has reached is high, the initial voltage of the program voltage in the U page write is adjusted to a higher value. Specifically, it is assumed that the initial voltage of the program voltage Vpgm0 (A) supplied in the U page write has been initialized to the initial voltage Vpgm0 appropriate for the memory cell having the fastest program speed.

First, at step S121 in the L page write, the write loop is performed.

Then, at step S122, the number of memory cells Nmc that has reached a predetermined threshold voltage Vtha is counted. Above steps S121 and S122 are repeated by stepping up the program voltage Vpgm until the number of memory cells Nmc reaches a predetermined number of memory cells Nmca (S123).

Then, at step S124, when the number of memory cells Nmc that has reached the threshold voltage Vtha is equal to or more than Nmca, the program voltage Vpgm is compared with a predetermined reference values X1 and X2 (X1>X2). If X1≦Vpgm, it is determined that the page has a slow program speed. The initial voltage of the program voltage supplied in the U page write is then adjusted to Vpgm0 (A)=Vpgm0+kA0×ΔVpgm0 (step S125). The ΔVpgm0 is an increment of the initial voltage Vpgm0 (A), and kA0 is a natural number. If X2≦Vpgm<X1, it is determined that the page has a somewhat fast program speed. The initial voltage is then adjusted to Vpgm0 (A)=Vpgm0+kA1×ΔVpgm0 (step S126), KA1 is a natural number less than kA0. If Vpgm<X2, it is determined that the page has a fast program speed. It is thus not necessary to adjust the initial voltage Vpgm0 (A) (step S127). Note that steps S122 to S127 are processed by the data write portion.

Then at steps S128 and S129, the remaining write loops in the L page write are performed. The threshold voltages of the memory cells MC included in a page thus change to the ER level or LM level.

Finally, at step S130, the initial voltages Vpgm0 (A) set at steps S124 to S127 are used to perform the U page write. Note that to suppress cell-to-cell interferences, a different-page write operation is performed between step S129 and step S130.

Data may thus be written using a program voltage having an initial voltage appropriate for the write characteristics that change over repeated write/erase cycles.

<Adjustment of Step Width of Program Voltage>

The initial voltage adjustment function by itself has problems as described below.

FIG. 7 shows an image of program voltages whose initial voltages are adjusted by the initial voltage adjustment function. With reference to FIG. 7, two different program voltages are compared. The first is a program voltage for writing data to a memory cell (hereinafter referred to as a "fresh cell") that has already completed a small number of write/erase cycles and thus has a large margin of endurance. The second is a program voltage for writing data to the memory cell (hereinafter referred to as a "cycled cell") that has already performed a large number of write/erase cycles and thus has a small margin of endurance.

The fresh cell has slower write characteristics than the cycled cell. The initial voltage of the program voltage is thus adjusted to a higher value by the initial voltage adjustment function. The write loop is then repeated with the program voltage stepped up by a predetermined step width ΔVpgm. Because the fresh cell has slower write characteristics, it completes the data write in relatively more loop numbers.

The cycled cell has faster write characteristics than the fresh cell. The cycled cell thus has the initial voltage adjusted to a lower value than the fresh cell by the initial voltage adjustment function. The write loop is then repeated with the program voltage stepped up by the same step width ΔVpgm as the fresh cell. Because the cycled cell has a faster write characteristics than the fresh cell, it completes the data write in less loop numbers than the fresh cell.

FIG. 8 shows the threshold voltage distributions of the memory cells for data write with a constant step width regardless of the different write characteristics of the memory cells as shown in FIG. 7.

Because the fresh cell has slower write characteristics, a somewhat large step width of the program voltage may still allow for a certain precise program. As shown above in FIG. 8, therefore, the threshold voltage of the memory cell distribution may have a relatively narrower value.

Because the cycled cell has faster write characteristics, a sufficiently small step width of the program voltage should be provided to allow for a precise program. As shown below in FIG. 8, therefore, the cycled cell has a broader threshold-voltage distribution of the memory cell than the fresh cell. A problem thus occurs that the data read/write has a lower reliability.

To avoid this problem, the step width of the program voltage may be set to a value appropriate for the cycled cell. The cycled cell as well as the fresh cell may thus maintain the reliability. In this case, however, the program to the fresh cell should be performed with a program voltage having a narrower step width, thereby requiring more write loops. The data write thus needs a more processing time.

This embodiment includes, therefore, in addition to the above initial voltage adjustment function, a step width adjustment function that adjusts the step width of the program voltage according to the memory cell endurance.

The step width adjustment function performs the following processes. The initial voltage of the program voltage provided by the initial voltage adjustment function is compared with the reference voltage stored in an element such as the ROM fuse 12. According to the voltage difference, the step width of the program voltage is adjusted. Note that the step adjustment function is processed mainly by an endurance determination portion. The endurance determination portion may be the controller 11 or be provided in the NAND chip 10. The endurance determination method may include, in addition to comparing the program voltage provided by the initial voltage adjustment function with the reference voltage, storing the number of write/erase operations on each block and the reference number in the controller 11 or the NAND chip 10, and then comparing the two numbers, thereby providing a similar effect. This embodiment provides, by way of example, the former endurance determination method, that is, the comparison of the program voltage provided by the initial voltage adjustment function with the reference voltage.

Figure 9:
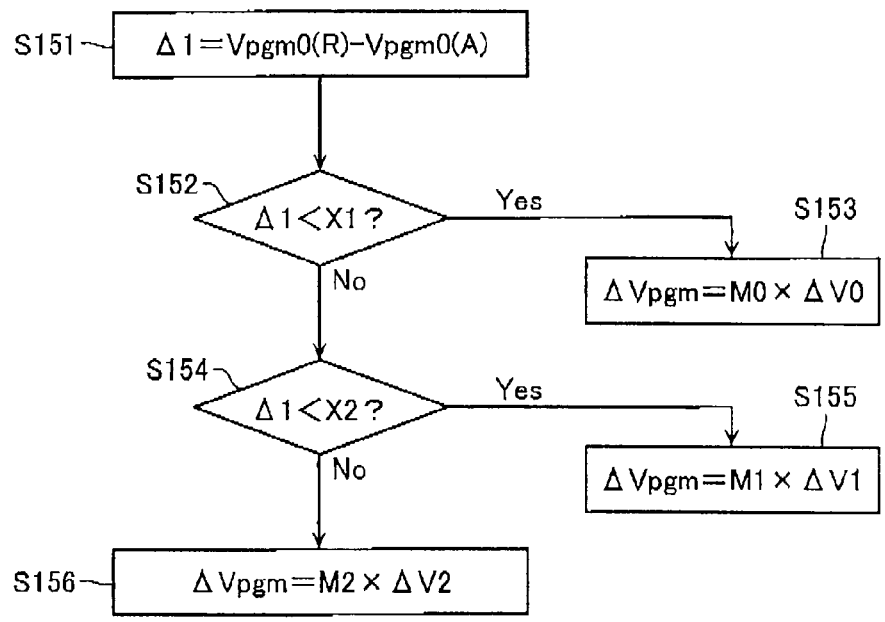
FIG. 9 is an example derivation flow of a step width by a step width adjustment function in the non-volatile semiconductor memory device according to this embodiment.

FIG. 9 is an example derivation flow of the step width by the step width adjustment function. It is assumed that the step width of the program voltage is provided by $\Delta Vpgm = M \times \Delta V$ (for example, M is an integer of 1 to 7, $\Delta V=0.1V$, 0.125V, 0.15V, 0.175V, and so on).

First, at step S151, the adjusted initial voltage Vpgm0 (A) derived from the initial voltage adjustment function is subtracted from the predetermined reference voltage Vpgm0 (R) to compute the difference Δ1.

Then, at step S152, the difference Δ1 is compared with the predetermined reference value X1. If Δ1<X1, it is believed that the memory cell has a slow program speed and thus it is determined that the memory cell is the fresh cell, which has a large margin of endurance. The step width is then set to $\Delta Vpgm = M0 \times \Delta V0$ (step S153). M0 and ΔV0 are any of the values that M and ΔV may take, respectively. Note that the step width may be initialized to $\Delta Vpgm = M0 \times \Delta V0$ to omit the process at step S153.

If Δ1≧X1, the process proceeds to step S154.

At step S154, the difference Δ1 is compared with the predetermined reference value X2 larger than the reference value X1. If Δ1<X2, that is, X1≦Δ1<X2, it is believed that the memory cell has a somewhat faster program speed, and thus it is determined that the endurance of the memory cell is somewhat reduced. The step width is then set to $\Delta Vpgm = M1 \times \Delta V1$ less than M0×ΔV0 (step S155). M0 and ΔV0 are any of the values that M and ΔV may take, respectively.

If Δ1≧X2, it is believed that the memory cell has a faster program speed, and thus it is determined that the memory cell is the cycled cell, which has a small margin of endurance. The step width is then set to $\Delta Vpgm = M2 \times \Delta V2$ less than M1×ΔV1 (step S156). M0 and ΔV0 are any of the values that M and ΔV may take, respectively.

Figure 10:
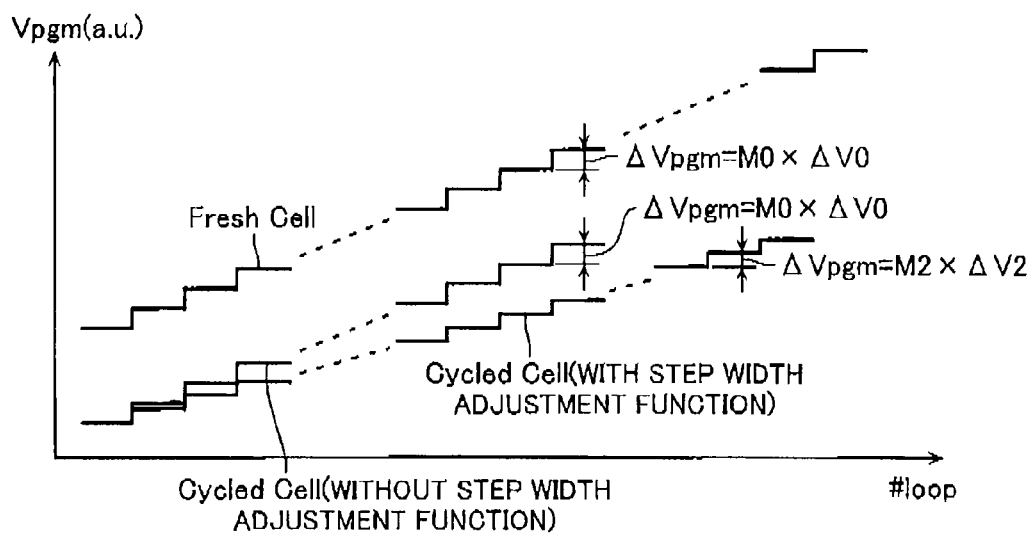
FIG. 10 shows an image of the program voltages supplied to the selected word-line of the non-volatile semiconductor memory device according to this embodiment.

FIG. 10 shows an image of the program voltages provided by the step width adjustment function. As an comparative example, as in FIG. 7, an image of the program voltages with the step width adjustment function not being used are shown.

With reference to FIG. 10, the step width adjustment function adjusts the step width ΔVpgm for the cycled cell to M2×ΔV2 less than the step width $\Delta Vpgm = M0 \times \Delta V0$ for the fresh cell. Therefore, even for the cycled cell, which has a faster program speed, a more precise program may be performed than when the step width ΔVpgm is not adjusted. The width of the threshold voltage distribution of the cycled cell may thus be suppressed, thus improving the data write reliability. Note that although it is desired to reduce the step width ΔVpgm, the number of write loops necessary for the data write will be increased, accordingly. With reference to FIG. 10, therefore, it is preferable to decrease the step width ΔVpgm without the number of write loops not exceeding the number of write loops necessary for the data write to the fresh cell. This may thus suppress the increase of the processing time necessary for the data write to some extent.

Figure 11:
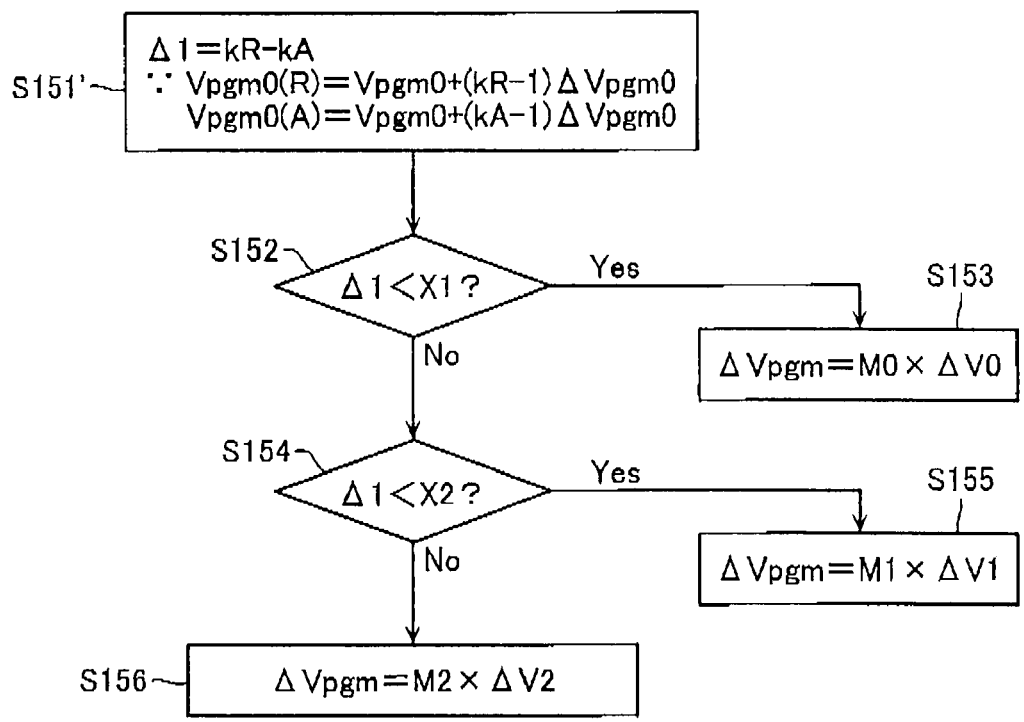
FIG. 11 is another example derivation flow of the step width by the step width adjustment function in the non-volatile semiconductor memory device according to this embodiment.

FIG. 11 shows another example derivation flow of the step width by the step width adjustment function. This flow is the same as that in the example shown in FIG. 9 except that step S151 is changed to different step S151'.

The initial voltage of the program voltage Vpgm0 (A) adjusted by the initial voltage adjustment function and the reference voltage Vpgm0 (R) as shown in FIG. 9 are each expressed as follows using the number of write loops. The adjusted initial voltage is expressed as Vpgm0 (A)=Vpgm0+(kA−1)×ΔVpgm0, where Vpgm0 is the initial voltage of the program voltage before adjusted by the initial voltage adjustment function, and ΔVpgm0 is the increment of the program voltage. Similarly, the reference voltage is expressed as Vpgm0 (R)=Vpgm0+(kR−1)×ΔVpgm0. Both of kA and kR are natural numbers. The above expressions show that the adjusted initial voltage Vpgm0 (A) and the reference voltage Vpgm0 (R) are each computed by an arithmetic progression.

In the derivation flow shown in FIG. 11, therefore, at step S151', the difference is computed as Δ1=kR−kA. The difference Δ1 may thus be computed using the number of increments of the program voltage corresponding to the number of write loops. The step width may thus be provided using a logic circuit simpler than the derivation flow shown in FIG. 9.

This embodiment may thus provide, without exceeding the processing time for the fresh cell, a data write having high reliability with the suppressed width of the threshold voltage distribution of the cycled cell.

Note that the non-volatile semiconductor memory device according to this embodiment may be added with one or both of a verify skip function similar to that in a second embodiment described below and a current consumption reduction function similar to that in a third embodiment.

Second Embodiment

A non-volatile semiconductor memory device according to a second embodiment includes, in addition to an initial voltage adjustment function similar to that in the first embodiment, a verify skip function to skip an extra verify operation.

Figure 12:
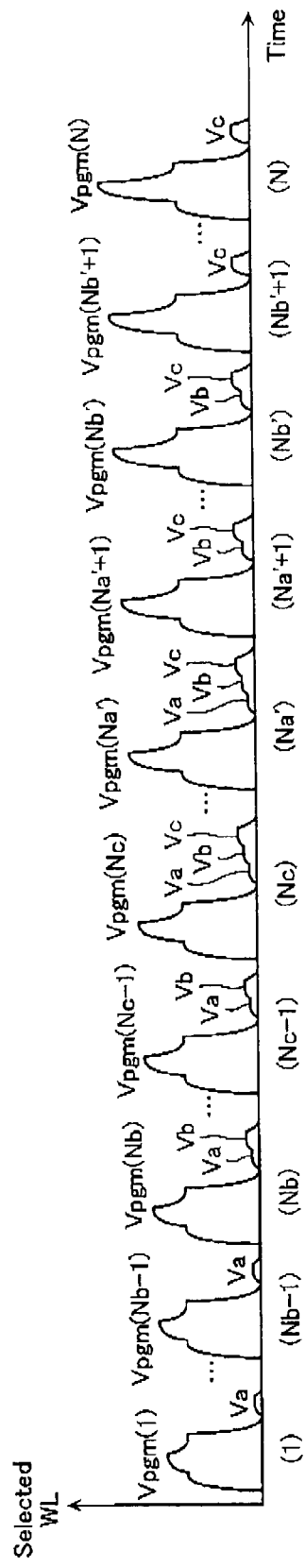
FIG. 12 is a waveform chart of the program voltage and the verify voltage supplied to the selected word-line when using the verify skip function.

FIG. 12 shows a program voltage and a verify voltage supplied to the selected word-line of the non-volatile semiconductor memory device according to this embodiment. Note that the program voltages Vpgm (1) to Vpgm (N) are the same as those in FIG. 4. As in FIG. 5, the supply of the program voltages Vpgm (1) to Vpgm (N) may change the threshold voltages of the memory cell.

With reference to FIG. 5, the program voltages Vpgm (1) to Vpgm (Nb−1) are insufficient voltages to change the threshold voltages of the memory cell to the B or C level. In the 1st to Nb−1th write loops, therefore, the verify for B and C levels are useless. Therefore, in this embodiment, as shown in FIG. 12, in the 1st to Nb−1th write loops, only the verify for A level is performed. Similarly, in the Nbth to Nc−1th write loops, the threshold voltage of the memory cell cannot change to the C level and so only the verify for A and B levels is performed.

In this way, the extra verify may be omitted to reduce the time for the data write.

Uniformly skipping the verify in specific write loops will however result in the following problems.

As described above, the memory cells usually have different write characteristics depending on their endurance. The fresh cell has a slow write speed, while the cycled cell has a fast write speed. The write loops that should have the verify skip are thus different between the fresh cell and the cycled cell as shown in FIG. 13.

For the fresh cell, in the 1st to Nb−1th write loops, only the verify for A level may be performed because the threshold voltage of the memory cell cannot change to the B or C level, as shown above in FIG. 13. Similarly, in the 1st to Nc1−1th write loops, only the verify for the A and B levels may be performed because the threshold voltage of the memory cell cannot change to the C level.

For the cycled cell, in the 1st to Nb2−1 (Nb2<Nb1)th write loops, only the verify for A level may be performed because the threshold voltage of the memory cell cannot change to the B or C level, as shown below in FIG. 13. Similarly, in the 1st to Nc2−1 (Nc2<Nc1)th write loops, only the verify for B and C levels may be performed because the threshold voltage of the memory cell cannot change to the C level. In other words, compared to the fresh cell, the verify skip lengths for the B and C levels should be reduced by the write loops of Nb1−Nb2 and the write loops of Nc1−Nc2, respectively.

In this case, the verify skip length may be set appropriate for the cycled cell. The necessary verify may thus be performed for the cycled cell as well as for the fresh cell. If, however, a short verify skip length is set for the fresh cell, an extra verify will be performed, accordingly, providing an insufficient effect.

This embodiment includes, therefore, a verify skip function that adjusts the verify skip length according to the memory cell endurance.

The verify skip function can compare the initial voltage of the program voltage provided by the initial voltage adjustment function with the reference voltage stored in an element such as the ROM fuse. The function may then adjust the verify skip length according to the difference. Note that the verify skip function is processed mainly by the endurance determination portion. The endurance determination portion may be the controller 11 or be provided in the NAND chip 10. The endurance determination method may include, in addition to comparing the program voltage provided by the initial voltage adjustment function with the reference voltage, storing the number of write/erase operations on each block and the reference number in the controller 11 or the NAND chip 10, and then comparing the two numbers, thereby providing a similar effect. This embodiment provides, by way of example, the former endurance determination method, that is, the comparison of the program voltage provided by the initial voltage adjustment function with the reference voltage.

Figure 14:
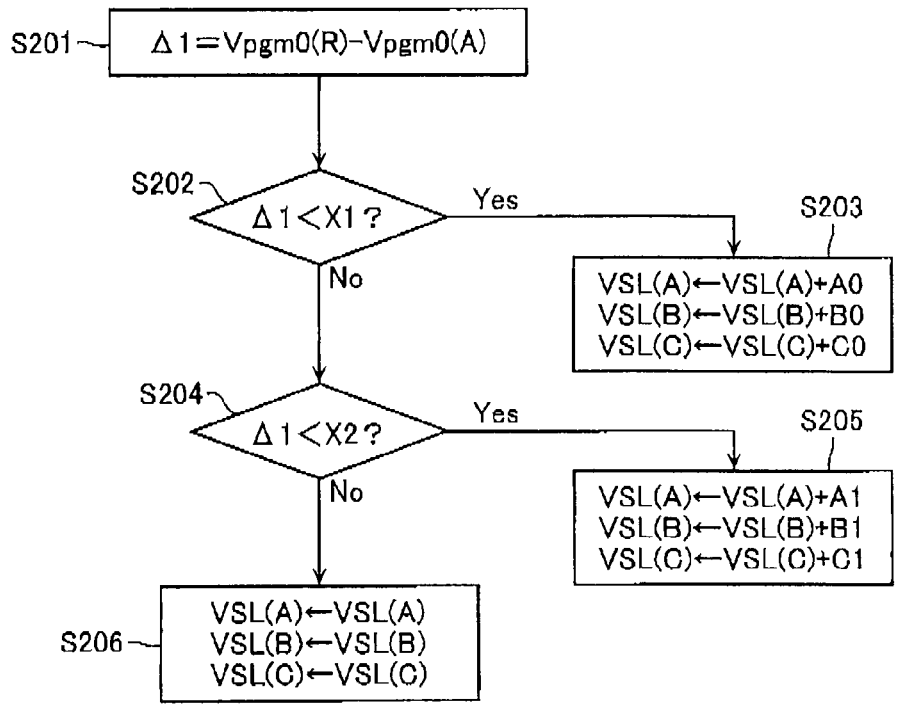
FIG. 14 is an example derivation flow of the verify skip length by the verify skip function in a non-volatile semiconductor memory device according to a second embodiment.

FIG. 14 is an example derivation flow of the verify skip length by the verify skip function. It is assumed that the verify skip length VSL (A) for the A level, the verify skip length VSL (B) for the B level, and the verify skip length VSL (C) for the C level are previously initialized to the verify skip lengths appropriate for the cycled cell.

First, at step S201, the difference Δ1 is computed like step S151 in FIG. 9.

Then at step S202, the difference Δ1 is compared with the predetermined reference value X1. If Δ1<X1, it is determined that the memory cell is the fresh cell, which has a large margin of endurance. The verify skip length VSL (A) for the A level is then added with A0 (A0 is a natural number). Similarly, the verify skip length VSL (B) for the B level is added with B0

(B0 is a natural number) and the verify skip length VSL (C) for the C level is added with C0 (C0 is a natural number) (step S203).

If $\Delta1 \geq X1$, the process proceeds to step S204.

At step S204, the difference $\Delta1$ is compared with the predetermined reference value X2 larger than the reference value X1. If $\Delta1 < X2$, that is, $X1 \leq \Delta1 < X2$, it is determined that the endurance of the memory cell is somewhat reduced. The verify skip length VSL (A) for the A level is then added with A1 (A1 is a natural number larger than A0). Similarly, the verify skip length VSL (B) for the B level is added with B1 (B1 is a natural number larger than B0), and the verify skip length VSL (C) for the C level is added with C1 (C1 is a natural number larger than C0) (step S205).

If $\Delta1 \geq X2$, it is determined that the memory cell is the cycled cell, which has a small margin of endurance. The verify skip length VSL (A) for the A level, the verify skip length VSL (B) for the B level, and the verify skip length VSL (C) for the C level are thus not adjusted because they are already appropriate values for the cycled cell (step S206).

Thus, the derivation of the verify skip length as shown in FIG. 14 may provide the appropriate verify skip according to the endurance of the memory cell as shown in FIG. 13.

Figure 15:
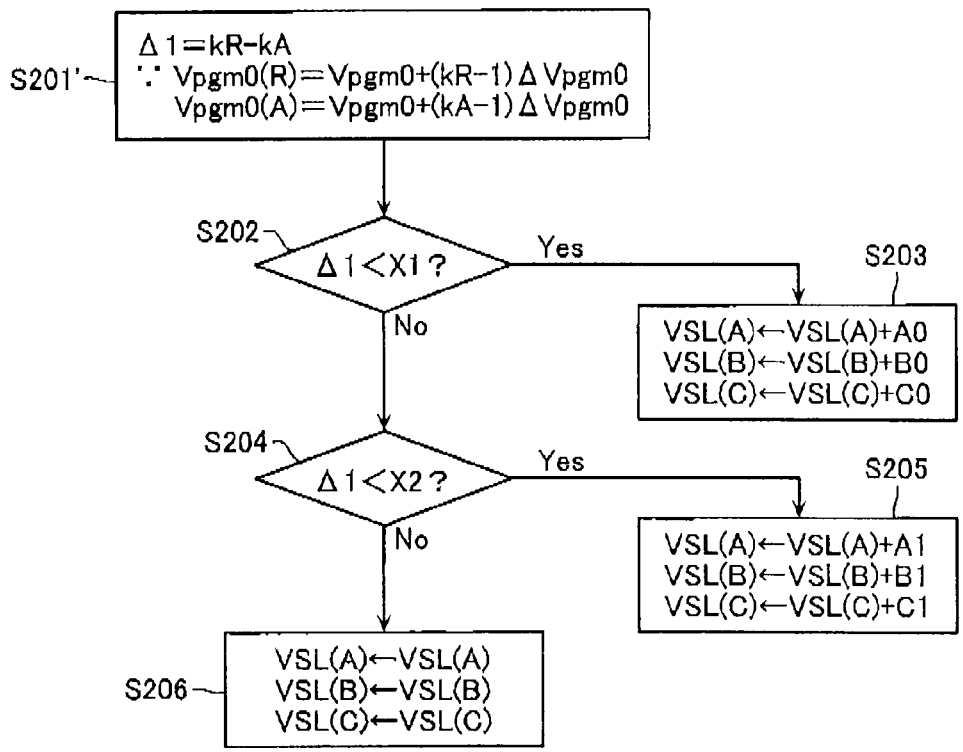
FIG. 15 is another example derivation flow of the verify skip length by the verify skip function in the non-volatile semiconductor memory device according to this embodiment.

FIG. 15 is another example derivation flow of the verify skip length by the verify skip function.

In this flow, first, at step S201', the difference is computed as $\Delta1 = kR - kA$ like step S151' shown in FIG. 11. The difference $\Delta1$ may thus be computed using the number of increments of the program voltage corresponding to the number of write loops. The step width may thus be provided using a logic circuit simpler than the derivation flow shown in FIG. 14.

The other steps are similar to those in the flow shown in FIG. 14 and their detailed description is omitted here.

Thus, this embodiment may provide, compared to when the extra verify is not skipped, less time for the data write and also derive the appropriate verify skip length according to the write characteristics of the memory cell. The time for the data write may thus be even less than when the constant verify skip length is used.

Note that the non-volatile semiconductor memory device according to this embodiment may be added with one or both of a step width adjustment function similar to that in the first embodiment and a current consumption reduction function similar to that in a third embodiment described below.

Third Embodiment

A non-volatile semiconductor memory device according to a third embodiment includes, in addition to an initial voltage adjustment function similar to that in the first embodiment, a current consumption reduction function to reduce the extra current consumption in the data write.

Figure 16:
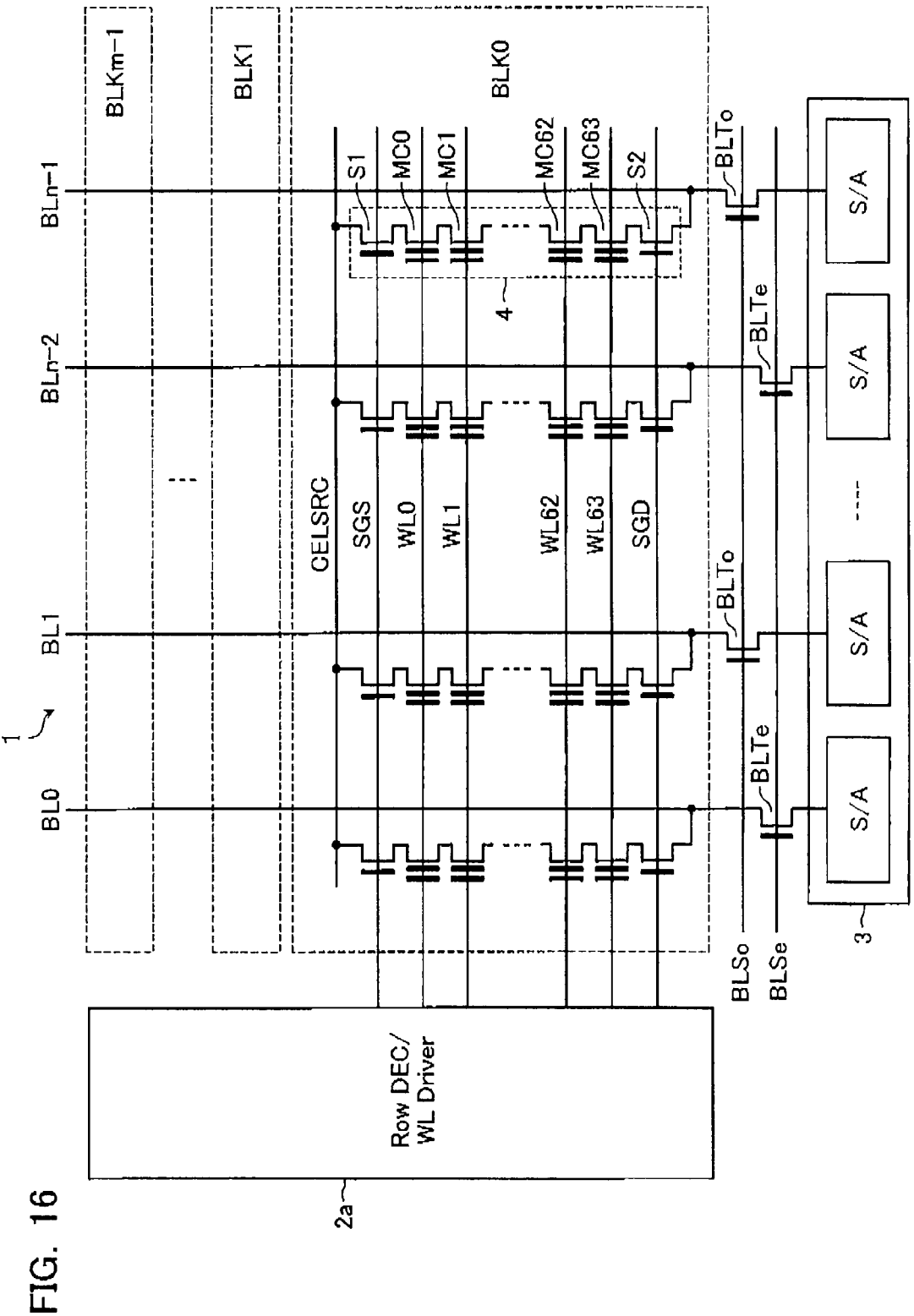
FIG. 16 is a circuit diagram of a memory cell array in a non-volatile semiconductor memory device according to a third embodiment.

First, as the base for describing the current consumption reduction function, a description is given of a specific configuration of the memory cell array 1 of the non-volatile semiconductor memory device and the peripherals thereof with reference to FIG. 16.

With reference to FIG. 16, this embodiment includes a bit-line select transistor BLTe and a bit-line select transistor BLTo. The bit-line select transistor BLTe is provided between an even-numbered bit-line BLe (e is an even number) and a sense amplifier circuit S/A. The bit-line select transistor BLTo is provided between an odd-numbered bit-line BLo (o is an odd number) and a sense amplifier circuit S/A.

A description is now given of the data write scheme of the non-volatile semiconductor memory device.

The data write to the non-volatile semiconductor memory device may be broadly classified into two schemes. One is the ABL scheme in which all memory cells along one selected word-line is written with data at the same time.

Figure 17A:
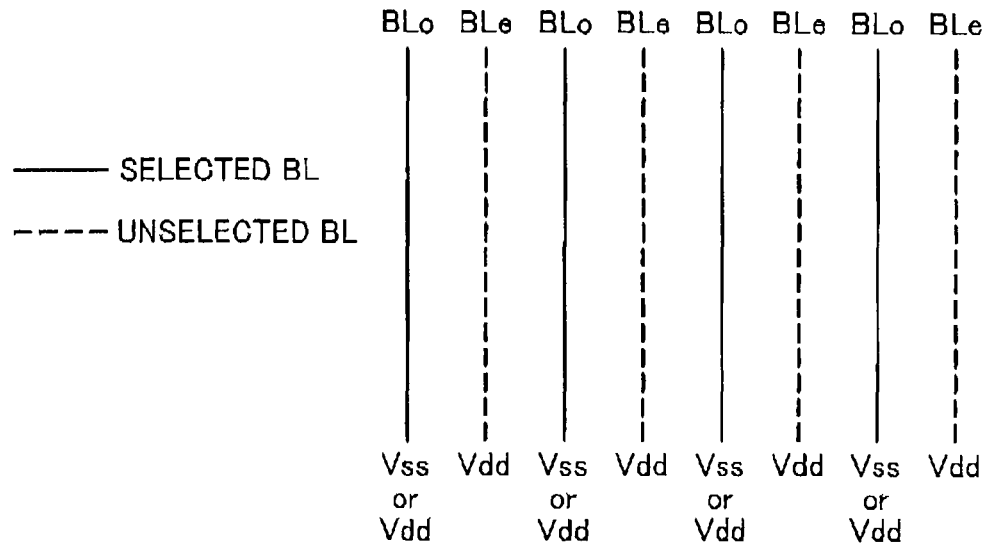
FIG. 17A shows bit-lines for data write in the non-volatile semiconductor memory device.

Another scheme is the E/O scheme in which, with reference to FIG. 17A, of the memory cells MC along one selected word-line, only the odd-numbered memory cells are written with data at the same time, while the even-numbered memory cells are inhibited from being written with data, or vice versa. For example, when the odd-numbered memory cells are the selected memory cells, the odd-numbered bit-lines BLo are supplied with a voltage (Vss or Vdd) depending on the write data, while the even-numbered bit-lines BLe are all supplied with the power supply voltage Vdd to inhibit the data write. Conversely, when the even-numbered memory cells are the selected memory cells, the even-numbered bit-lines BLe are supplied with a voltage (Vss or Vdd) depending on the write data, while the odd-numbered bit-lines BLo are all supplied with the power supply voltage Vdd to inhibit the data write.

In the E/O scheme, a channel adjacent to the channel where the selected memory cells are positioned is always provided with a voltage of about Vdd. Compared to the ABL scheme, therefore, the E/O scheme may suppress the variation of the programming condition to the selected memory cell from the viewpoint of the capacitive coupling with the adjacent channel.

Figure 17B:
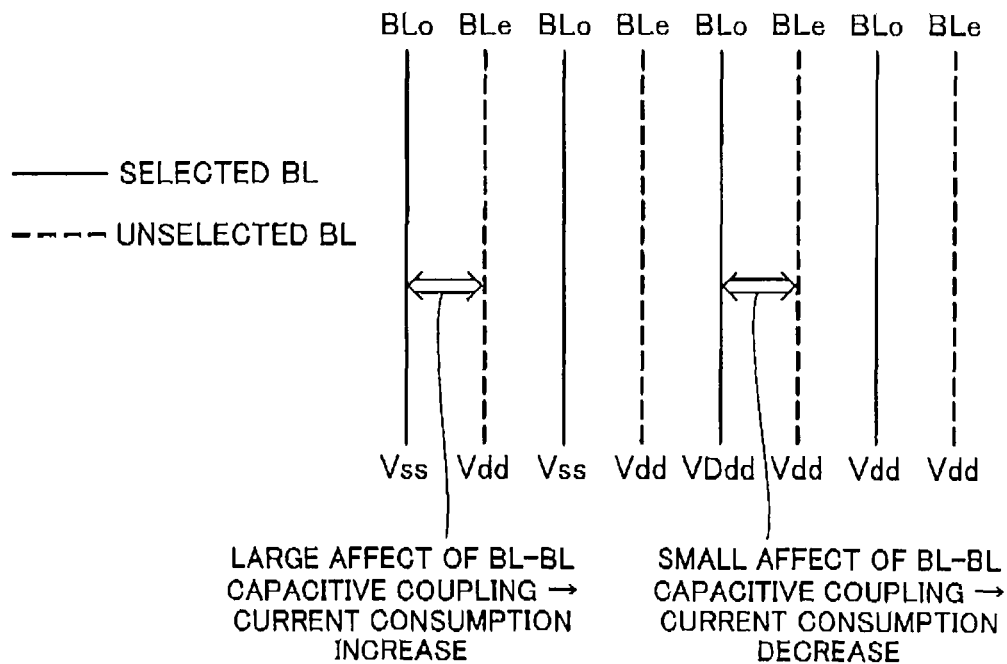
FIG. 17B shows bit-lines for data write in the non-volatile semiconductor memory device.

In the E/O scheme, however, in the selected bit-lines BL (for example, the odd-numbered bit-lines BLo), increase of the number of bit-lines BL supplied with the voltage Vss for the program will increase the number of adjacent bit-lines BL having a large potential difference therebetween. Charging the unselected bit-lines BL (for example, the even-numbered bit-lines BLe) to the voltage Vdd thus needs a large current consumption, resulting in more power consumption (see FIG. 17B). It is therefore desired to suppress the power consumption by also supplying the selected bit-lines BL with the voltage Vdd as much as possible. Even in the ABL scheme, if the write data is random, the adjacent cells are likely to have different write data, and so the more adjacent bit-lines BL may have a large potential difference therebetween. It is therefore desired to suppress the power consumption by also supplying the selected bit-lines BL with the voltage Vdd as much as possible.

Now consider that the program voltage and the verify voltage as shown in FIG. 4 and FIG. 5 are used for the data write. With reference to FIG. 5, the program voltages Vpgm (1) to Vpgm (Nb−1) are insufficient voltages to change the threshold voltage of the memory cell to the B or C level. In the 1st to Nb−1th write loops, therefore, the selected bit-lines BL connected to the memory cell MC (A) are supplied with the program permission voltage Vss, while the selected bit-lines BL connected to the memory cells MC (B) and MC (C) are supplied with the program inhibit voltage Vdd to inhibit the program. Similarly, in the Nbth to Nc−1th write loops, because the threshold voltage of the memory cell cannot change to the C level, the selected bit-lines BL connected to the memory cell MC (C) are supplied with the program inhibit voltage Vdd to inhibit the program.

The program inhibition period is generally as long as the period during which the verify should be skipped. Uniformly inhibiting the program in specific write loops will therefore result in problems similar to those described in the second embodiment. In other words, because the memory cell's endurance determines the period during which the program should be inhibited, a program inhibit period that is set appropriate for the cycled cell will decrease the reduction efficiency of the current consumption in the data write to the fresh cell.

This embodiment includes, therefore, a current consumption reduction function to adjust the program inhibit period according to the memory cell's endurance.

The current consumption reduction function may compare the initial voltage of the program voltage provided by the initial voltage adjustment function with the reference voltage stored in an element such as the ROM fuse 12. The function may then adjust the program inhibit period according to the difference. Note that the program inhibit period adjustment function is processed mainly by the endurance determination portion. The endurance determination portion may be the controller 11 or be provided in the NAND chip 10. The endurance determination method may include, in addition to comparing the program voltage provided by the initial voltage adjustment function with the reference voltage, storing the number of write/erase operation on each block and the reference number in the controller 11 or the NAND chip 10, and then comparing the two numbers, thereby providing a similar effect. This embodiment provides, by way of example, the former endurance determination method, that is, the comparison of the program voltage provided by the initial voltage adjustment function with the reference voltage.

Figure 18:
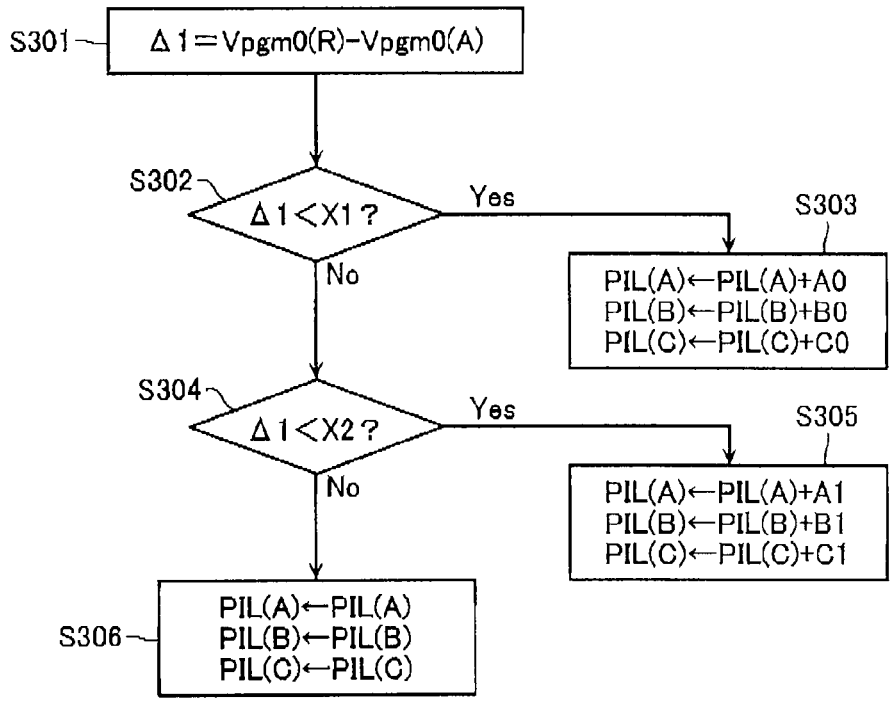
FIG. 18 is an example derivation flow of a program inhibit period by a current consumption reduction function in the non-volatile semiconductor memory device according to this embodiment.

FIG. 18 is an example derivation flow of the program inhibit period by the current consumption reduction function. It is assumed that the program inhibit period PIL (A) for the memory cell MC (A) to be changed to the A level, the program inhibit period PIL (B) for the memory cell MC (B) to be changed to the B level, and the program inhibit period PIL (C) for the memory cell MC (C) to be changed to the C level are previously initialized to the program inhibit periods appropriate for the cycled cell.

First, at step S301, the difference Δ1 is computed like step S151 in FIG. 9.

Then, at step S302, the difference Δ1 is compared with the predetermined reference value X1. If Δ1<X1, it is determined that the memory cell is the fresh cell, which has a large margin of endurance. The program period PIL (A) for the memory cell MC (A) is added with A0 (A0 is a natural number). Similarly, the program inhibit period PIL (B) for the memory cell MC (B) is added with B0 (B0 is a natural number), and the program inhibit period PIL (C) for the memory cell MC (C) is added with C0 (C0 is a natural number) (step S303).

If Δ1≧X1, the process proceeds to step S304.

At step S304, the difference Δ1 is compared with the predetermined reference value X2 larger than the reference value X1. If Δ1<X2, that is, X1≦Δ1<X2, it is determined that the endurance of the memory cell is somewhat reduced. The program inhibit period PIL (A) for the memory cell MC (A) is thus added with A1 (A1 is a natural number larger than A0). Similarly, the program inhibit period PIL (B) for the memory cell MC (B) is added with B1 (B1 is a natural number larger than B0), and the program inhibit period PIL (C) for the memory cell MC (C) is added with C1 (C1 is a natural number larger than C0) (step S305).

If Δ≧X2, it is determined that the memory cell is the cycled cell, which has a small margin of endurance. The program inhibit period PIL (A) for the memory cell MC (A), the program inhibit period PIL (B) for the memory cell MC (B), and the program inhibit period PIL (C) for the memory cell MC (C) are thus not adjusted because they are already appropriate values for the cycled cell (step S306).

Thus, the derivation of the program inhibit period as shown in FIG. 18 may provide the effective current consumption reduction according to the memory cell's endurance.

Figure 19:
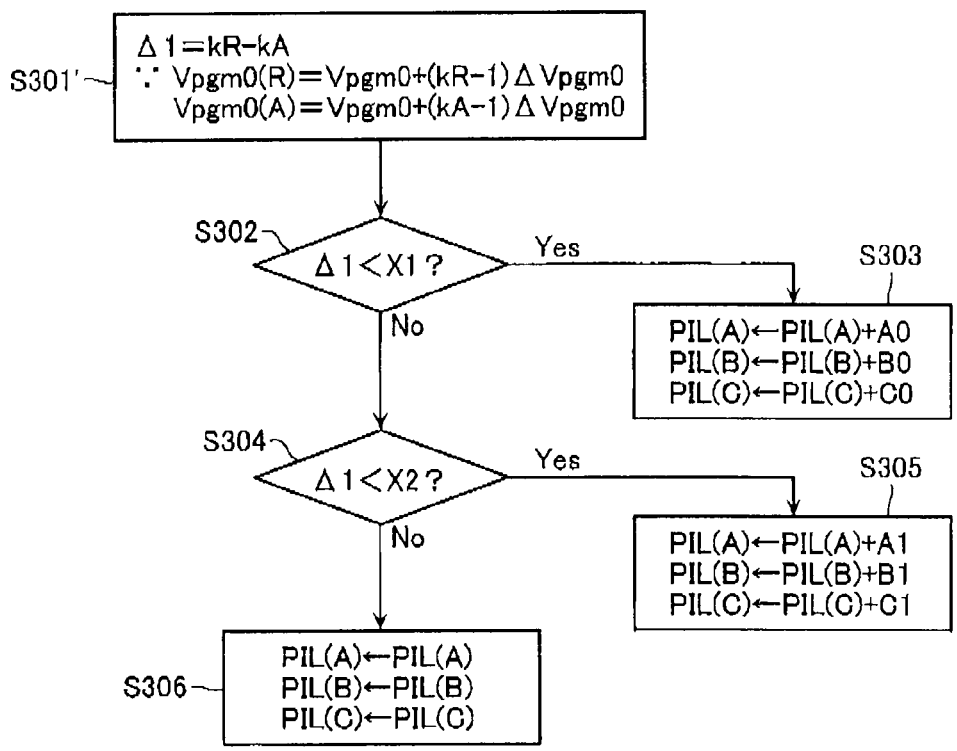
FIG. 19 is another example derivation flow of the program inhibit period by the current consumption reduction function in the non-volatile semiconductor memory device according to this embodiment.

FIG. 19 is another example derivation flow of the program inhibit period by the current consumption reduction function.

In this flow, first, at step S301', the difference is computed as Δ1=kR−kA like step S151' shown in FIG. 11. The difference Δ1 may thus be computed using the number of increments of the program voltage corresponding to the number of write loops. The step width may thus be provided using a logic circuit simpler than the derivation flow shown in FIG. 18.

The other steps are similar to those in the flow shown in FIG. 18 and their detailed description is omitted here.

Thus, this embodiment may provide less current consumption in the data write than the non-volatile semiconductor memory device in the E/O scheme that always supplies the program permission voltage Vss to the selected bit-line, and may appropriately adjust the program inhibit period according to the write characteristics of the memory cell, thereby providing a higher efficiency of the current consumption reduction than when the program inhibit period is constant.

Note that the non-volatile semiconductor memory device according to this embodiment may be added with one or both of a step width adjustment function similar to that in the first embodiment and a verify skip function similar to that in the second embodiment. In particular, when the verify skip function is added, the program inhibit periods PIL (A), PIL (B), and PIL (C) derived by the flows shown in FIG. 18 and FIG. 19 may be the common one, and so may the verify skip lengths VSL (A), VSL (B), and VSL (C) derived by the flows shown in FIG. 14 and FIG. 15.

Fourth Embodiment

The first embodiment includes one reference voltage Vpgm0 (R). The memory cells or the pages may have, however, different write characteristics depending on their positions in the memory cell array 1.

For example, in the memory cell array 1 in FIG. 2, the word-line WL0 or WL63 near the ends of the NAND string 4 may have different write characteristics from the other word-lines WL1 to WL62. Moreover, the word-line WL0 near the common source-line CELSRC may have different write characteristics from the word-line WL63 near the sense amplifier circuit S/A. In the word-lines WL1 to WL62, the write characteristics may be varied depending on whether the word-line WL is the odd-numbered word-line WL or the even-numbered word-line WL.

Figures 20, 21:
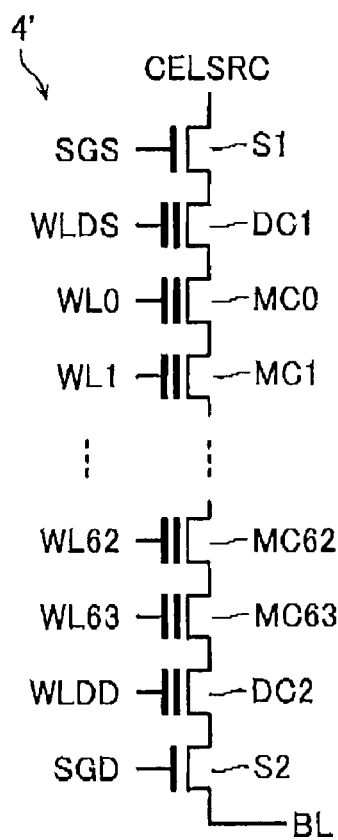
FIG. 20 is a circuit diagram of a NAND string in a non-volatile semiconductor memory device according to a fourth embodiment.
FIG. 21 shows an example allocation of the reference voltage for use in the initial voltage adjustment function in the non-volatile semiconductor memory device according to this embodiment.

The same holds true for the NAND string 4' shown in FIG. 20. The NAND string 4' includes a dummy cell DC1 between the memory cell MC0 and the select gate transistor S1, the dummy cell DC1 being controlled by a dummy word-line WLDS. The NAND string 4' also includes a dummy cell DC2 between the memory cell MC63 and the select gate transistor S2, the dummy cell DC2 being controlled by a dummy word-line WLDD. Such a configuration may reduce the variation of the write characteristics or the like between the memory cells MC0 and MC63 and the other memory cells MC1 to MC62, the MC0 and MC63 being at the ends of the NAND string 4'. The variation cannot be completely removed, however.

The fourth embodiment provides, therefore, a non-volatile semiconductor memory device that includes, in addition to an initial voltage setting function and a step width adjustment function similar to those in the first embodiment, a plurality of reference voltages Vpgm0 (R) used in the step width adjustment function.

FIG. 21 shows an example where a plurality of different reference voltages Vpgm0 (R) are provided at different positions of the word-line WL.

In this example, the word-lines WL0 to 2k−1 (k is a natural number, k=32 in FIG. 2 and FIG. 20) are divided into four groups; the word-line WL0 nearest to the common source-line CELSRC; the odd-numbered word-lines WL2*m*–1 (m=1 to k–1); the even-numbered word-lines WL2*m*; and the word-line WL2*k*–1 nearest to the sense amplifier circuit S/A. Depending on whether the word-line WL to select a page for the data write is the word-line WL0, WL2*m*–1, WL2*m*, or WL2*k*–1, a different reference voltage Vpgm0 (R, 0), Vpgm0 (R, 2m–1), Vpgm0 (R, 2m), or Vpgm0 (R, 2k–1) is used. These reference voltages Vpgm0 (R) may be set appropriate for the write characteristics of the word-lines WL, thereby allowing for more precise program and thus higher data-write reliability than in the first embodiment.

Figures 22, 23:
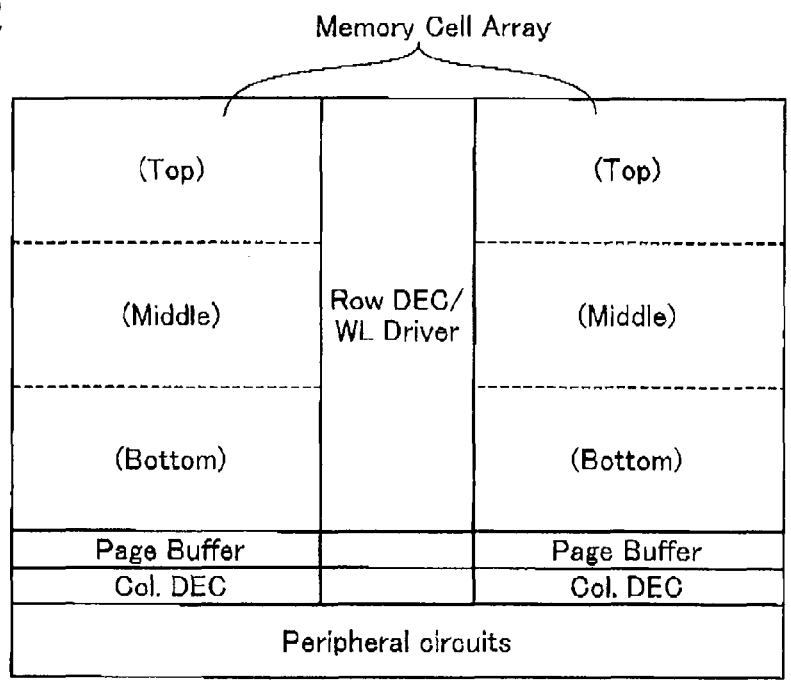
FIG. 22 shows an example arrangement of the memory cell array in the non-volatile semiconductor memory device according to this embodiment.
FIG. 23 shows an allocation example of the reference voltage for use in an initial value adjustment function in the non-volatile semiconductor memory device according to this embodiment.

FIG. 22 and FIG. 23 show other examples of this embodiment.

In these examples, the memory cell arrays are broadly classified into three blocks in the bit-line direction; a top block (Top); a middle block (Middle); and a bottom block (Bottom). The memory cell arrays in each block are divided into four groups depending on the position of the word-line WL like the examples shown in FIG. 20 and FIG. 21. In each block, each area is provided with the appropriate reference voltage Vpgm0 (R, g, and b) (g is 0, 2m–1, 2m, or 2k–1 depending on the position of the word-line WL, b is T (the top block), M (the middle block), or B (the bottom block) depending on the block).

In these examples, taking into account of the different write characteristics of the different blocks, the four reference voltages may be individually set for each block, thereby allowing for more precise program and thus higher data-write reliability than in the example in FIG. 21.

Note that the above examples may be applied in the first embodiment as well as in the second and third embodiments in a similar manner. The effects of the verify skip function and the current consumption reduction function may thus be further improved.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Although the first to fourth embodiments have been described with respect to the example non-volatile semiconductor memory device in which data is written, by two write steps, to the memory cell storing two-bit per one cell, any of the above embodiments may be applied, regardless of the number of storage bits per one cell, to any non-volatile semiconductor memory devices that write data by multiple write steps.

Although in the above embodiments, the endurance of the memory cell is determined in terms of the program speed difference, the endurance of the memory cell may also be determined in terms of the number of write/erase cycles. A counter may then additionally be provided to count the number of write/erase cycles.

What is claimed is:

1. A non-volatile semiconductor memory device comprising:
   a memory cell array comprising a plurality of bit-lines, a plurality of word-lines intersecting the bit-lines, a source-line, and a plurality of NAND cell units, each NAND cell unit comprising a plurality of memory cells connected in series, each memory cell comprising a control gate connected to one of the word-lines, each NAND cell unit comprising ends connected to one of the bit-lines and the source-line, respectively;
   a data write portion configured to write data to the memory cell array by repeating a write loop until the data write is complete, the write loop comprising a program operation of applying a selected word-line of the word-lines with a program voltage necessary for program and a verify operation of applying the selected word-line with a verify voltage necessary for verify, the program voltage being changed for each write loop by a predetermined step width, the data write being performed in units of a page comprising a plurality of memory cells selected by the selected word-line; and
   an endurance determination portion configured to determine the endurance of the memory cells of the page,
   the data write portion supplying the selected word-line with a program voltage of a step width depending on the endurance.

2. The non-volatile semiconductor memory device according to claim 1, wherein
   in the data write, the data write portion performs
   a first write step of performing the write loops comprising a first write loop of a predetermined write loop, and after the first write loop, counting the number of memory cells that have reached a desired storage state,
   using the program voltage at which the number of memory cells that have reached the desired storage state has reached a predetermined number of memory cells to set the initial voltage of the program voltage, and
   a second write step of performing the write loops using the initial voltage of the program voltage.

3. The non-volatile semiconductor memory device according to claim 2, wherein
   the endurance determination portion determines the endurance by comparing the initial voltage of the program voltage at the second write step, the initial voltage being set by the data write portion, with a predetermined reference voltage.

4. The non-volatile semiconductor memory device according to claim 3 wherein
   the reference voltage has different values depending on the page.

5. The non-volatile semiconductor memory device according to claim 3, wherein
   the endurance determination portion compares the initial voltage of the program voltage with the reference voltage by computing the difference between the initial voltage of the program voltage and the reference voltage.

6. The non-volatile semiconductor memory device according to claim 3, wherein
   when the program voltage is adjusted by a predetermined increment,
   the endurance determination portion compares the initial voltage of the program voltage with the reference voltage by computing the difference between the number of increments for the initial voltage of the program voltage and the number of increments for the reference voltage.

7. The non-volatile semiconductor memory device according to claim 1, wherein
   the data write portion uses, in the data write, the endurance determined by the endurance determination portion to determine the number of write loops repeated until desired data is written to the memory cell, and skips the verify operation of the data in the write loop until the number is reached.

8. The non-volatile semiconductor memory device according to claim 1, wherein
the data write portion uses, in the data write, the endurance determined by the endurance determination portion to determine the number of write loops repeated until desired data is written to the memory cell, and applies, until the number is reached, a program inhibit voltage for inhibiting a program to the bit-line connected to the memory cell to be programmed with the desired data, and
the data write portion applies, in the program operation using the program voltage at which the desired data may be written to the memory cell, a program permission voltage for permitting a program to the bit-line connected to the memory cell to be programmed with the desired data.

9. A non-volatile semiconductor memory device comprising:
a memory cell array comprising a plurality of bit-lines, a plurality of word-lines intersecting the bit-lines, a source-line, and a plurality of NAND cell units, each NAND cell unit comprising a plurality of memory cells connected in series, each memory cell comprising a control gate connected to one of the word-lines, each NAND cell unit comprising ends connected to one of the bit-lines and the source-line, respectively;
a data write portion configured to write data to the memory cell array by repeating a write loop until the data write is complete, the write loop comprising a program operation of applying a selected word-line of the word-lines with a program voltage necessary for program and a verify operation of applying the selected word-line with a verify voltage necessary for verify, the program voltage being changed for each write loop by a predetermined step width, the data write being performed in units of a page comprising a plurality of memory cells selected by the selected word-line; and
an endurance determination portion configured to determine the endurance of the memory cells of the page,
the data write portion uses, in the data write, the endurance determined by the endurance determination portion to determine the number of write loops repeated until desired data is written to the memory cell, and skips the verify operation of the data in the write loop until the number is reached.

10. The non-volatile semiconductor memory device according to claim 9, wherein
in the data write, the data write portion performs
a first write step of performing the write loops comprising a first write loop of a predetermined write loop, and after the first write loop, counting the number of memory cells that have reached a desired storage state,
using the program voltage at which the number of memory cells that have reached the desired storage state has reached a predetermined number of memory cells to set the initial voltage of the program voltage, and
a second write step of performing the write loops using the initial voltage of the program voltage.

11. The non-volatile semiconductor memory device according to claim 10, wherein
the endurance determination portion determines the endurance by comparing the initial voltage of the program voltage at the second write step, the initial voltage being set by the data write portion, with a predetermined reference voltage.

12. The non-volatile semiconductor memory device according to claim 11 wherein
the reference voltage has different values depending on the page.

13. The non-volatile semiconductor memory device according to claim 11, wherein
the endurance determination portion compares the initial voltage of the program voltage with the reference voltage by computing the difference between the initial voltage of the program voltage and the reference voltage.

14. The non-volatile semiconductor memory device according to claim 11, wherein
when the program voltage is adjusted by a predetermined increment,
the endurance determination portion compares the initial voltage of the program voltage with the reference voltage by computing the difference between the number of increments for the initial voltage of the program voltage and the number of increments for the reference voltage.

15. The non-volatile semiconductor memory device according to claim 9, wherein
the data write portion uses, in the data write, the endurance determined by the endurance determination portion to determine the number of write loops repeated until desired data is written to the memory cell, and applies, until the number is reached, a program inhibit voltage for inhibiting a program to the bit-line connected to the memory cell to be programmed with the desired data, and
the data write portion applies, in the program operation using the program voltage at which the desired data may be written to the memory cell, a program permission voltage for permitting a program to the bit-line connected to the memory cell to be programmed with the desired data.

16. A non-volatile semiconductor memory device comprising:
a memory cell array comprising a plurality of bit-lines, a plurality of word-lines intersecting the bit-lines, a source-line, and a plurality of NAND cell units, each NAND cell unit comprising a plurality of memory cells connected in series, each memory cell comprising a control gate connected to one of the word-lines, each NAND cell unit comprising ends connected to one of the bit-lines and the source-line, respectively;
a data write portion configured to write data to the memory cell array by repeating a write loop until the data write is complete, the write loop comprising a program operation of applying a selected word-line of the word-lines with a program voltage necessary for program and a verify operation of applying the selected word-line with a verify voltage necessary for verify, the program voltage being changed for each write loop by a predetermined step width, the data write being performed in units of a page comprising a plurality of memory cells selected by the selected word-line; and
an endurance determination portion configured to determine the endurance of the memory cells of the page,
the data write portion uses, in the data write, the endurance determined by the endurance determination portion to determine the number of write loops repeated until desired data is written to the memory cell, and applies, until the number is reached, a program inhibit voltage for inhibiting a program to the bit-line connected to the memory cell to be programmed with the desired data, and the data write portion applies, in the program operation using the program voltage at which the desired data may be written to the memory cell, a program permission voltage for permitting a program to the bit-line connected to the memory cell to be programmed with the desired data.

17. The non-volatile semiconductor memory device according to claim 16, wherein in the data write, the data write portion performs a first write step of performing the write loops comprising a first write loop of a predetermined write loop, and after the first write loop, counting the number of memory cells that have reached a desired storage state, using the program voltage at which the number of memory cells that have reached the desired storage state has reached a predetermined number of memory cells to set the initial voltage of the program voltage, and a second write step of performing the write loops using the initial voltage of the program voltage.

18. The non-volatile semiconductor memory device according to claim 17, wherein the endurance determination portion determines the endurance by comparing the initial voltage of the program voltage at the second write step, the initial voltage being set by the data write portion, with a predetermined reference voltage.

19. The non-volatile semiconductor memory device according to claim 18 wherein the reference voltage has different values depending on the page.

20. The non-volatile semiconductor memory device according to claim 18, wherein when the program voltage is adjusted by a predetermined increment, the endurance determination portion compares the initial voltage of the program voltage with the reference voltage by computing the difference between the number of increments for the initial voltage of the program voltage and the number of increments for the reference voltage.

* * * * *